(12) United States Patent
Jeon et al.

(10) Patent No.: US 12,131,968 B2
(45) Date of Patent: Oct. 29, 2024

(54) SENSOR MOUNTED WAFER

(71) Applicant: E-TRON CO., LTD., Seoul (KR)

(72) Inventors: Ho Seung Jeon, Uijeongbu-si (KR); Mun Seong Jo, Hwaseong-si (KR); Seong Joo Hwang, Ansan-si (KR); Rae Won Jang, Suwon-si (KR)

(73) Assignee: E-TRON CO., LTD., Seoul (KR)

( * ) Notice: Subject to any disclaimer, the term of this patent is extended or adjusted under 35 U.S.C. 154(b) by 674 days.

(21) Appl. No.: 17/255,436

(22) PCT Filed: Nov. 10, 2020

(86) PCT No.: PCT/KR2020/015689
§ 371 (c)(1),
(2) Date: Dec. 23, 2020

(87) PCT Pub. No.: WO2022/092386
PCT Pub. Date: May 5, 2022

(65) Prior Publication Data
US 2023/0046603 A1   Feb. 16, 2023

(30) Foreign Application Priority Data

Oct. 30, 2020   (KR) .......................... 10-2020-0143579
Oct. 30, 2020   (KR) .......................... 10-2020-0143580

(51) Int. Cl.
*H01L 21/66* (2006.01)
*H05K 1/18* (2006.01)

(52) U.S. Cl.
CPC ............. *H01L 22/34* (2013.01); *H05K 1/181* (2013.01); *H05K 2201/10151* (2013.01)

(58) Field of Classification Search
CPC ......... H01L 22/34; H01L 22/14; H01L 21/67; H05K 1/181; H05K 2201/10151; H05K 2201/052; H05K 2201/09027; H01J 37/32
See application file for complete search history.

(56) References Cited

U.S. PATENT DOCUMENTS

2007/0113652 A1 * 5/2007 Renken .................. G01D 9/005
73/509
2011/0233546 A1   9/2011 Higashi et al.
(Continued)

FOREIGN PATENT DOCUMENTS

KR   20060009885 A   2/2006
KR   20180033572 A   4/2018
(Continued)

*Primary Examiner* — Su C Kim
(74) *Attorney, Agent, or Firm* — Bayramoglu Law Offices LLC

(57) ABSTRACT

The present invention provides a sensor mounted wafer, including: a lower case in which a mounting groove is formed; a circuit board on which a plurality of electronic components having different heights are mounted, and placed in the mounting groove; an upper case in which a plurality of insertion grooves having different depths are formed, and bonded together to the lower case so that the plurality of electronic components are inserted into the plurality of insertion grooves; and an adhesive layer placed between the mounting groove and the plurality of insertion grooves, in which the insertion grooves are formed to have different depths according to the heights of the plurality of the electronic components.

13 Claims, 25 Drawing Sheets

VI - VI

(56) References Cited

U.S. PATENT DOCUMENTS

2018/0374776 A1* 12/2018 Liu .................... H01L 23/3737
2019/0154511 A1*  5/2019 Van Buggenhout .... G01J 5/026
2019/0348340 A1* 11/2019 Kwon ................ H01L 23/3675
2020/0083072 A1   3/2020 Quli et al.

FOREIGN PATENT DOCUMENTS

KR         101917832 B1   11/2018
KR        20190066193 A    6/2019
KR        20200038440 A    4/2020

* cited by examiner

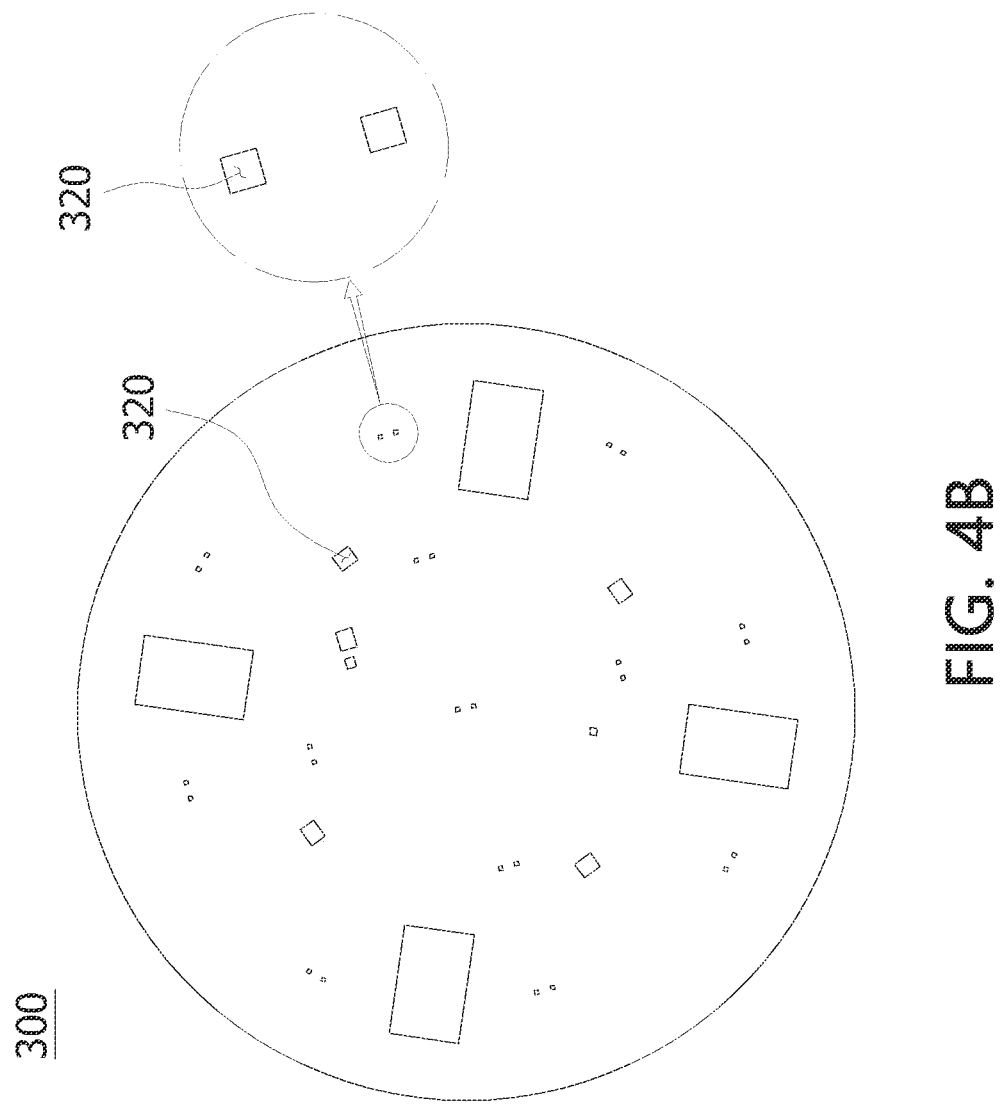

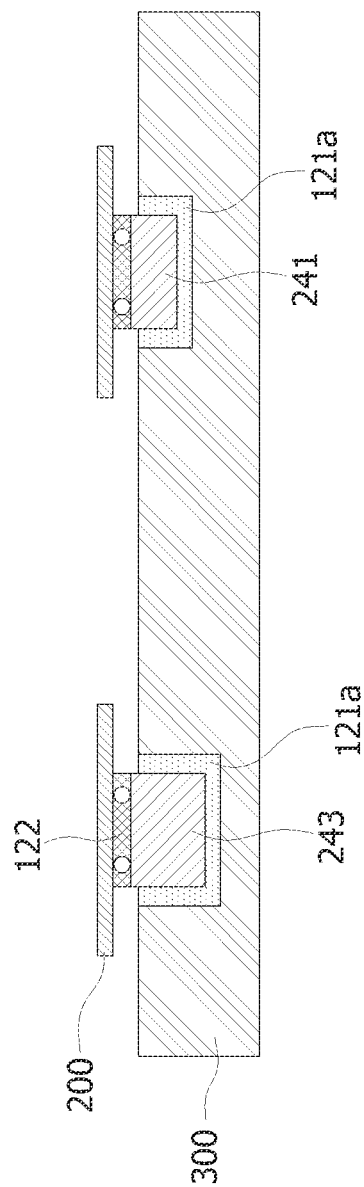

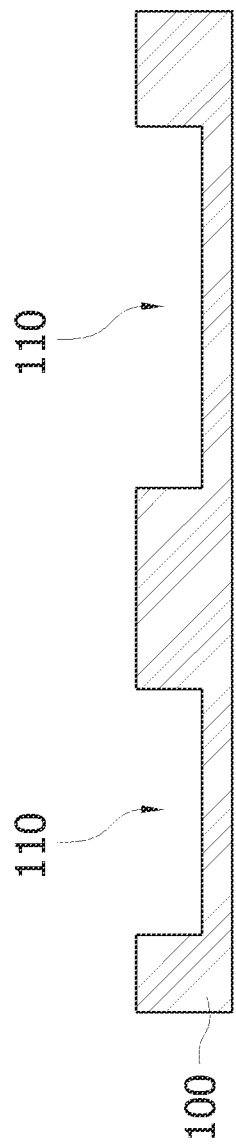

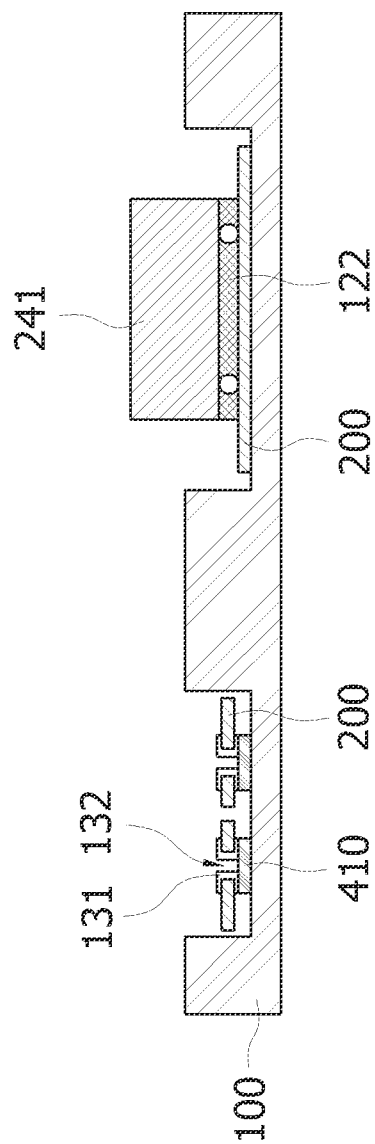

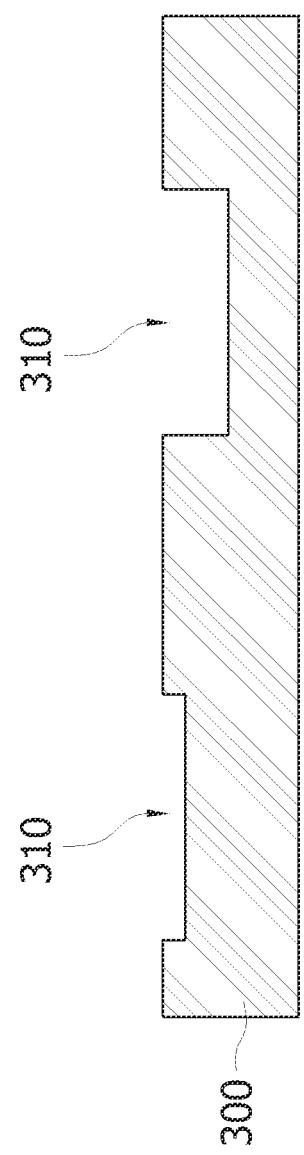

SENSOR MOUNTED WAFER

CROSS-REFERENCE TO RELATED APPLICATIONS

This application is the national stage entry of International Application No. PCT/KR2020/015689, filed on Nov. 10, 2020, which is based upon and claims priority to Korean Patent Application No. 10-2020-0143579, filed on Oct. 30, 2020, and Korean Patent Application No. 10-2020-0143580, filed on Oct. 30, 2020, the entire contents of which are incorporated herein by reference.

TECHNICAL FIELD

The present invention relates to a sensor mounted wafer.

BACKGROUND

In general, semiconductor manufacturing goes through a number of processes including optical, deposition, growth, and etching processes.

Semiconductor manufacturing processes require careful monitoring of process conditions and equipment operating conditions in each process. For example, precise monitoring is essential for optimal semiconductor yield while controlling the temperature, gas injection state, pressure state, plasma density or exposure distance of a chamber or wafer.

If an error occurs in the process conditions related to temperature, plasma, pressure, flow rate and gas, or if the equipment malfunctions, many defects occur, which is fatal to the overall yield.

Meanwhile, in the related art, the process conditions in the chamber were indirectly measured in semiconductor manufacturing, but research has been developed to directly measure the internal conditions of the chamber or the state of the wafers loaded in the chamber in order to improve the semiconductor yield. One of them is SOW (Sensor On Wafer) which is developed as a wafer temperature sensing technology.

In general, the SOW mounts a plurality of sensors and electronic components between two test wafers, and directly senses semiconductor manufacturing process conditions in a chamber using the mounted sensors.

However, the conventional SOW, even though the heights of a plurality of sensors and electronic components are different, forms cavities in the wafer at the same depth, and mounts the plurality of sensors and electronic components in the cavities.

According to such a conventional SOW, there is a problem in that since the plurality of sensors and electronic components are not in close contact with each other within the wafer, durability is deteriorated, and sensor mounted wafer warpage phenomenon occurs when the temperature rises.

In addition, the conventional SOW includes 2 wafers combined, and if these wafers are formed to have the same thickness of 750 μm, the total thickness of the SOW is 1500 μm. However, if the thickness of the wafer is 1200 μm or more, there is a problem that the number of wafers is recognized as two.

In the conventional SOW, the sensing probe is directly exposed to the outside to sense the density of plasma. However, such a method has a problem of contaminating the interior of the chamber due to the exposed sensing probe.

The above information disclosed in this Background section is only for enhancement of understanding of the background of the invention and it may therefore contain information that does not form the prior art that is already known to a person of ordinary skill in the art.

SUMMARY

The present invention is directed to providing a sensor mounted wafer capable of preventing sensor mounted wafer warpage phenomenon caused due to temperature rise by improving durability of the sensor mounted wafer.

In addition, the present invention is directed to providing a plasma sensor mounted wafer and manufacturing method thereof capable of solving problems that the plasma sensor mounted wafer is recognized as two wafers and a sensing probe contaminates the interior of a chamber.

The technical problems to be achieved in the present invention are not limited to the technical problems mentioned above, and other technical problems not mentioned will be clearly understood by those of ordinary skill in the art from the following description.

The present invention provides a sensor mounted wafer, including: a lower case in which a mounting groove is formed; a circuit board on which a plurality of electronic components having different heights are mounted, and placed in the mounting groove; an upper case in which a plurality of insertion grooves having different depths are formed, and bonded together to the lower case so that the plurality of electronic components are inserted into the plurality of insertion grooves; and an adhesive layer placed between the mounting groove and the plurality of insertion grooves, in which the insertion grooves are formed to have different depths according to the heights of the plurality of the electronic components.

Here, the plurality of insertion grooves are formed to have depths corresponding to the heights of the plurality of electronic components.

In addition, the plurality of electronic components include a plurality of first electronic components having heights higher than a reference height and a plurality of second electronic components having heights lower than the reference height.

In addition, the plurality of insertion grooves include a first insertion groove formed to have a depth corresponding to the height of the electronic component having the highest height among the plurality of first electronic components and a second insertion groove formed to have a depth corresponding to the height of the electronic component having the highest height among the plurality of second electronic components.

In addition, lower portions of the plurality of electronic components are located inside the mounting groove and upper portions of the plurality of electronic components are located inside the plurality of insertion grooves.

In addition, portions in which the lower portions of the plurality of electronic components are mounted have deeper depth than other portions.

In addition, the mounting groove has an inclined plane formed corresponding to the lower edges of the plurality of electronic components. In addition, the mounting groove is formed in a shape corresponding to the circuit board and the plurality of insertion grooves are formed in a shape corresponding to the plurality of electronic components.

In addition, the plurality of electronic components include a plasma sensor.

In addition, the sensor mounted wafer of the present invention further includes a sensing probe including a pair of probe pads placed in the mounting groove, and being connected to the plasma sensor through wiring formed on the circuit board, in which the plasma sensor senses plasma based on the capacitance between the pair of probe pads.

In addition, the thickness of the lower case is thinner than the thickness of the upper case.

In addition, the sensing probe further includes a contact hole formed in the wiring end, and a conductive pattern passing through the contact hole to connect the pair of probe pads and the wiring end.

In addition, the contact holes are respectively formed at positions corresponding to the pair of probe pads.

According to the present invention, since the depths of the plurality of insertion grooves into which the plurality of electronic components are inserted are formed differently according to the heights of the plurality of electronic components whereby the plurality of electronic components may come into close contact with each of the insertion grooves, durability of the sensor mounted wafer may be improved, thereby preventing sensor mounted wafer warpage phenomenon when the temperature rises.

In addition, according to the present invention, the mounting groove in which the circuit board is mounted has the inclined plane formed corresponding to the lower edges of the plurality of electronic components whereby the circuit board corresponding to the lower edges of the plurality of electronic components may be also gently bent along the inclined plane to reduce resistance.

According to the present invention, it is possible to solve the problem that the plasma sensor mounted wafer is recognized as two wafers by forming the thickness of the lower case to be thinner than the thickness of the upper case.

In addition, according to the present invention, it is possible to solve the problem of contamination inside the chamber by making the sensing probe, unlike the conventional ones, without exposing it to the outside, to sense the density and uniformity of the plasma based on the capacitance between the pair of probe pads that is changed according to the external plasma density.

The effects of the present invention are not limited to those mentioned above, and other effects not mentioned will be clearly understood by those of ordinary skill in the art from the following description.

BRIEF DESCRIPTION OF THE DRAWINGS

The above and other aspects, features, and advantages of the present disclosure will become more apparent to those of ordinary skill in the art by describing embodiments thereof in detail with reference to the accompanying drawings, in which:

FIGS. 4A and 4B are top plan views of an upper case of a sensor mounted wafer according to an exemplary embodiment of the present invention;

FIGS. 7A to 7E are sequence diagrams of a method of manufacturing a sensor mounted wafer according to an exemplary embodiment of the present invention based on FIG. 6A;

FIGS. 8A to 8I are sequence diagrams of a method of manufacturing a sensor mounted wafer according to an exemplary embodiment of the present invention based on FIG. 6B.

DETAILED DESCRIPTION OF THE EMBODIMENTS

Figure 1:
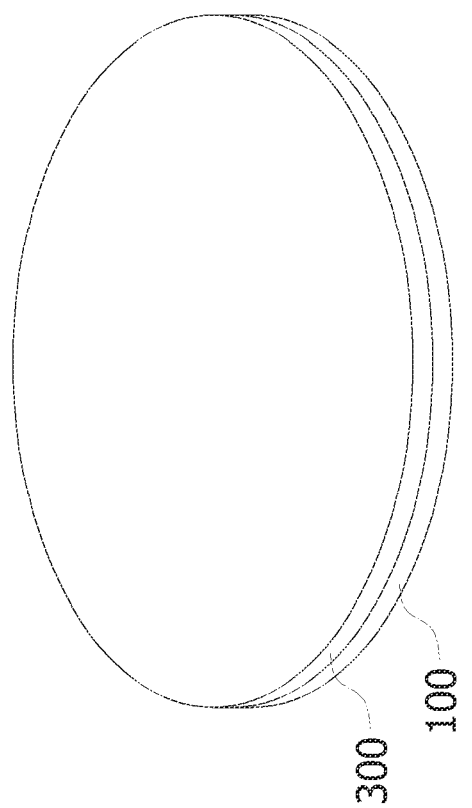
FIG. 1 is a perspective view of a sensor mounted wafer according to an exemplary embodiment of the present invention.

Hereinafter, the embodiments of the present invention are described in detail with reference to the accompanying drawings. The detailed description to be disclosed hereinafter with the accompanying drawings is intended to describe exemplary embodiments of the present invention and is not intended to represent the only embodiments in which the present invention may be implemented. In the drawings, parts unrelated to the description may be omitted for clarity of description of the present invention, and like reference numerals may designate like elements throughout the specification.

In an embodiment of the present invention, expressions such as "or" and "at least one" may represent one of words listed together or a combination of two or more. For example, "A or B" and "at least one of A and B" may include only one of A or B, or may also include both A and B.

Figure 2A:
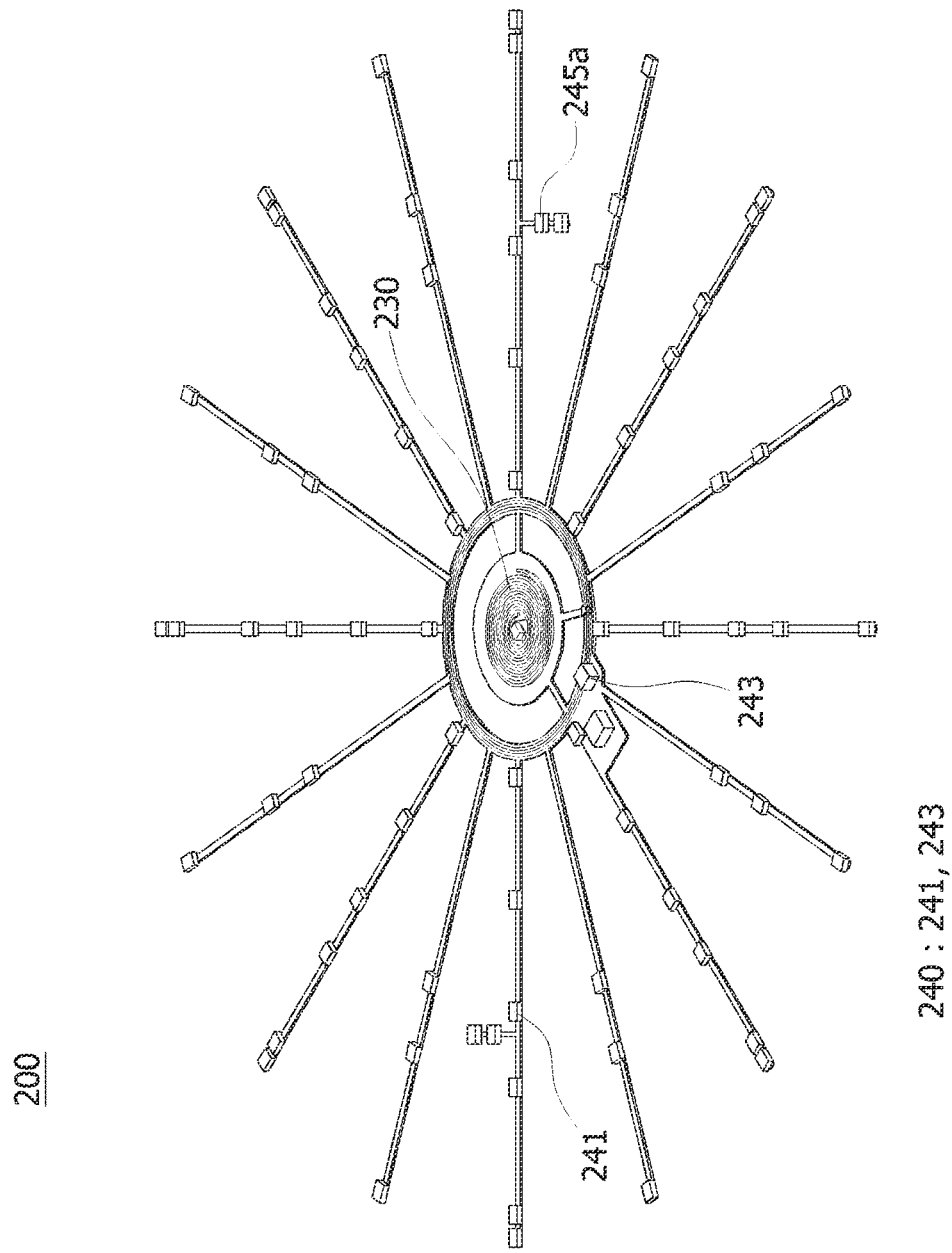
FIGS. 2A and 2B are top plan views of a circuit board included in a sensor mounted wafer according to an exemplary embodiment of the present invention.
Figure 2B:
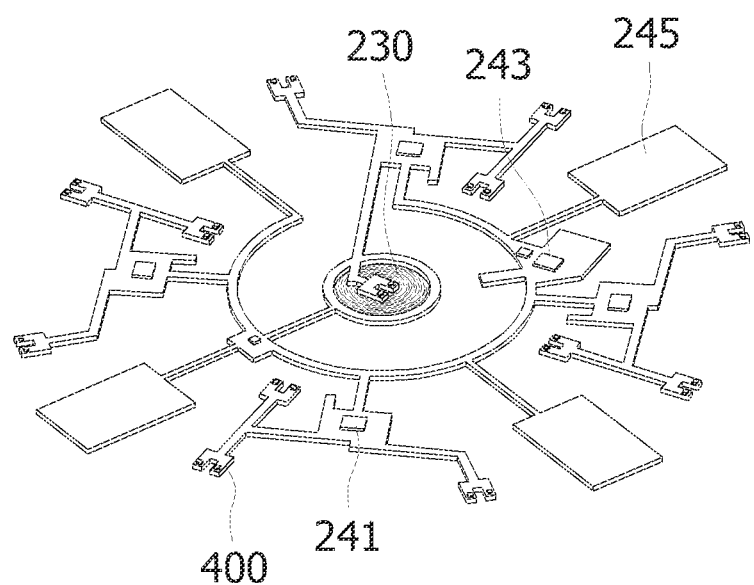

FIG. 1 is a perspective view of a sensor mounted wafer according to an exemplary embodiment of the present invention; and FIGS. 2A and 2B are top plan views of a circuit board included in a sensor mounted wafer according to an exemplary embodiment of the present invention.

Referring to FIGS. 1, 2A and 2B, the sensor mounted wafer according to an embodiment of the present invention may include a lower case 100, a circuit board 200, and an upper case 300.

The lower case 100 and the upper case 300 may be formed in a disk shape, and may be made of the same material. In particular, the lower case 100 and the upper case 300 may include materials with excellent electrical characteristics including silicon (Si) and gallium arsenide (GaAs), doped with high concentration.

The circuit board 200 mounts a plurality of electronic components 240 having different heights and is placed between the lower case 100 and the upper case 300. Here, the electronic component 240 is a component of an electronic circuit, and may include at least one of a sensor 241, an integrated circuit (IC) chip 243, and a battery (245 in FIGS. 5A and 5B).

In addition, the circuit board 200 is a printed circuit board (PCB) with wiring printed thereon so that the sensor 241, the IC chip 243, and the battery (245 in FIGS. 5A and 5B) are electrically connected.

In addition, referring to FIG. 2B, the sensor 241 may be a plasma sensor 241, be provided in plural, and embedded in a predetermined sensing position of the sensor mounted wafer to perform sensing for monitoring semiconductor process at the corresponding position. Specifically, the plasma sensor 241 may be connected through wiring to a sensing probe 400 and may sense the density and uniformity of plasma in a semiconductor process environment.

Here, one plasma sensor 241 may be connected a plurality of sensing probes 400 to minimize power consumption.

The sensing probe 400 is provided in plural, and is provided at a predetermined sensing position of a plasma sensor mounted wafer.

The integrated circuit (IC) chip 243 may include a control IC chip, a communication IC chip, and a memory.

The communication IC chip, which has a configuration for wireless communication with the outside, wirelessly transmits sensing information sensed by the sensor 241, and wirelessly receives control information for controlling the operation of the sensor 241.

Here, the control information may include a process in which the sensor mounted wafer is to be used, and conditions required for the process. For example, the control information may define a process for which the sensor mounted wafer is used, and may include set values for a sensing temperature, a sensing time, and a sensing method used in the defined process.

The control IC chip may control the operation of the sensor 241 using the control information. That is, the control IC chip may control the sensor 241 to operate based on the set values included in the control information.

The communication IC chip is connected to a communication antenna 230 to perform wireless communication with the outside. Here, the communication antenna 230 may be formed in a coil shape of a spiral loop and may be formed in a ring shape at the center of the circuit board 200, but is not limited thereto.

The circuit board 200 may include a battery terminal 245*a* on which a battery (245 in FIGS. 5A and 5B) is mounted. Here, the battery (245 in FIGS. 5A and 5B) supplies power for driving components including the sensor 241 and the IC chip 243 included in the sensor mounted wafer.

The memory may store control information for controlling the operation of the sensor 241 and may store sensing information sensed by the sensor 241. Further, the memory may store log data recording a process in which the sensor mounted wafer is used.

Here, the log data may include information on in which process and under which conditions the sensor mounted wafer was used.

Figure 3A:
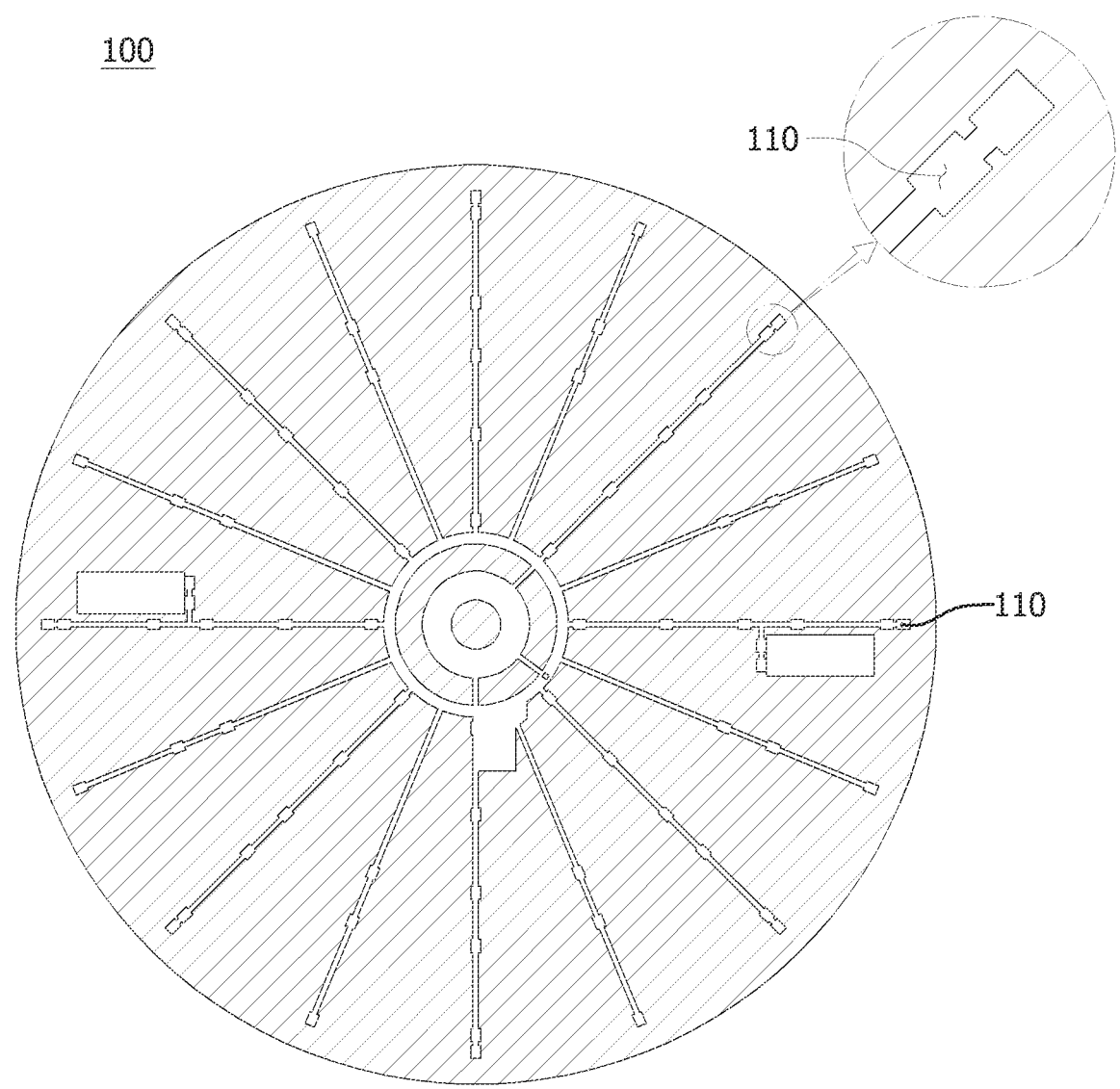
FIGS. 3A and 3B are top plan views of a lower case of a sensor mounted wafer according to an exemplary embodiment of the present invention.
Figure 3B:
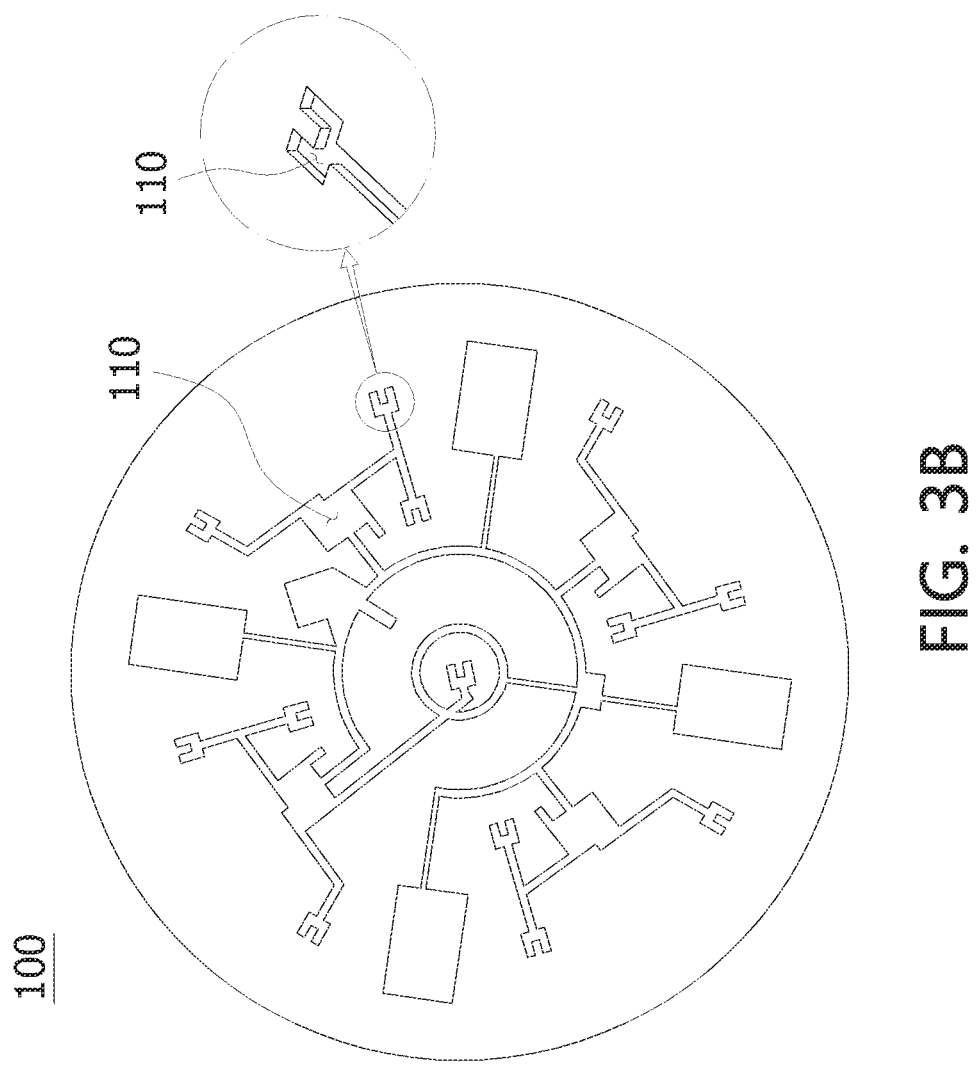
Figure 4A:
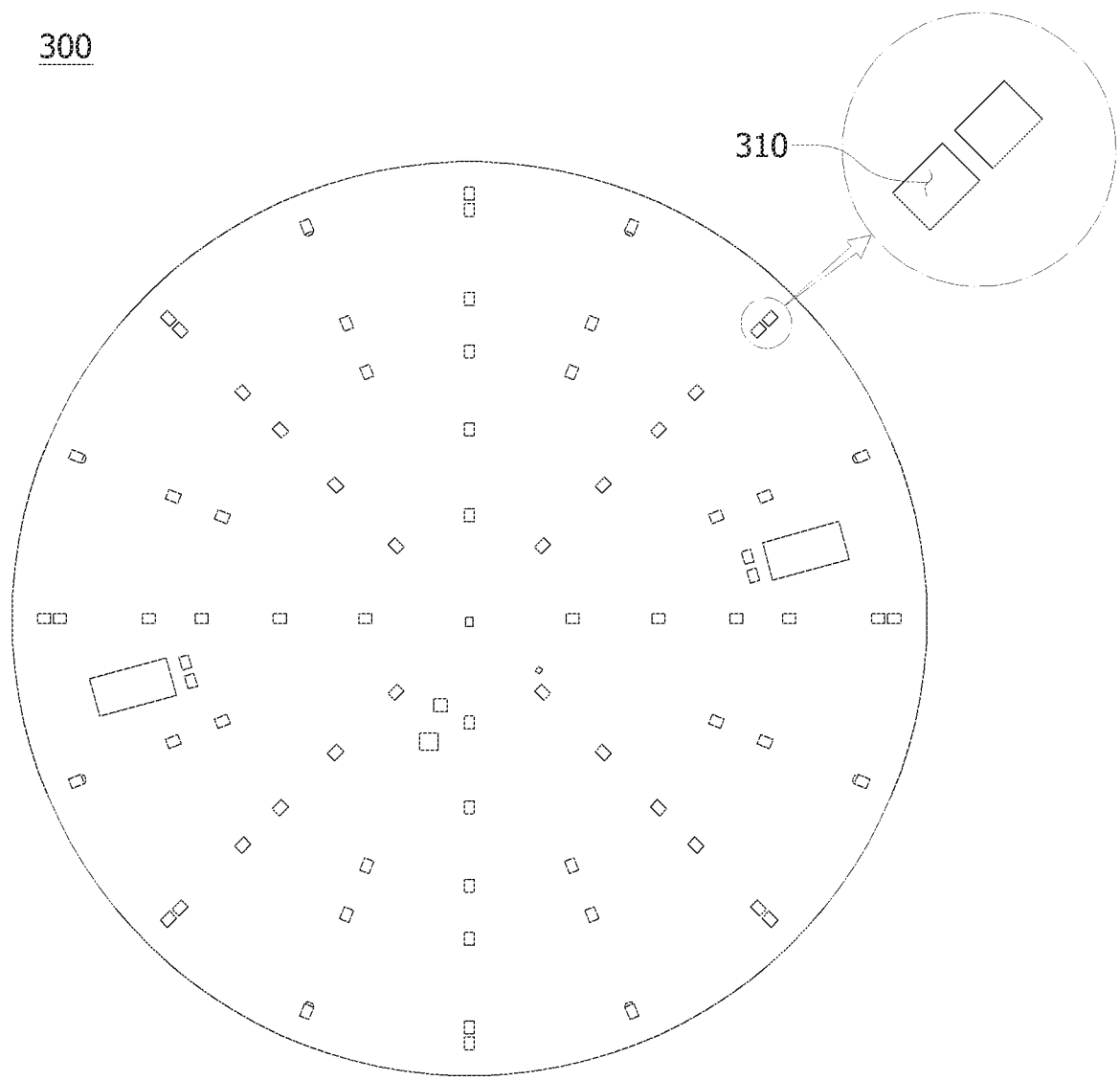
Figure 5A:
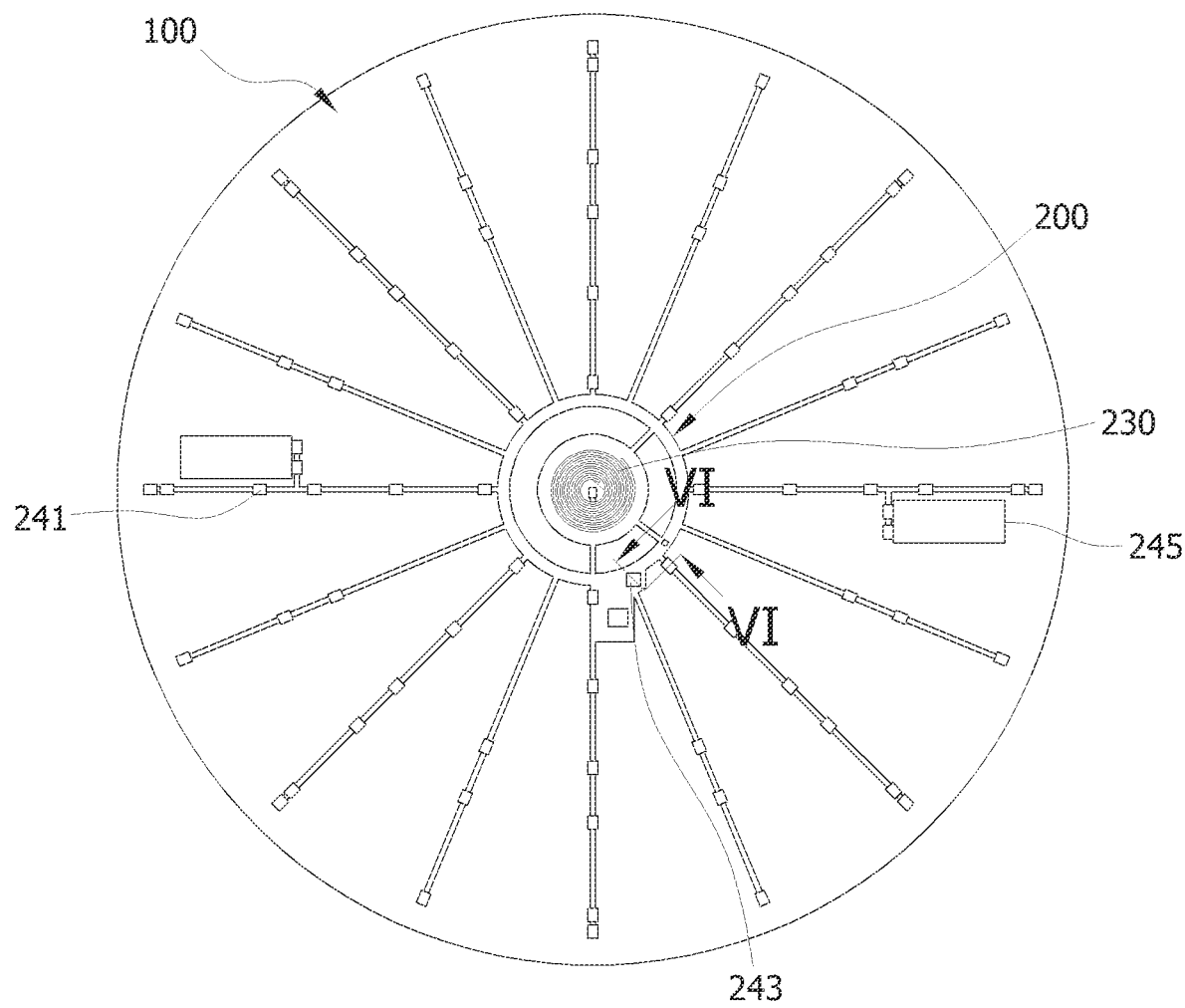
FIGS. 5A and 5B are views illustrating a circuit board mounted on the lower case of FIGS. 3A and 3B.
Figure 5B:
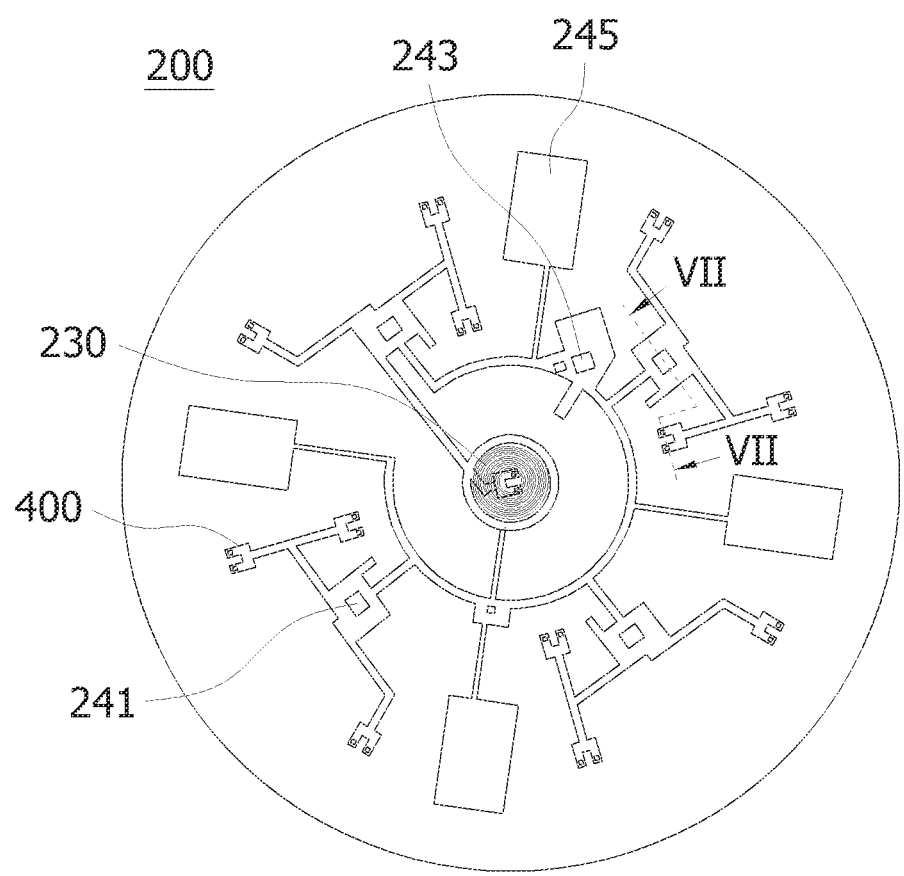

FIGS. 3A and 3B are top plan views of a lower case of a sensor mounted wafer according to an exemplary embodiment of the present invention; FIGS. 4A and 4B are top plan views of an upper case of a sensor mounted wafer according to an exemplary embodiment of the present invention; and FIGS. 5A and 5B are views illustrating a circuit board mounted on the lower case of FIGS. 3A and 3B.

Referring to FIGS. 3A, 3B, 5A, and 5B, on a lower case 100, a mounting groove 110 in which a circuit board 200 is mounted is formed in a shape corresponding to a circuit board 200.

Referring to FIGS. 4A, 4B, 5A, and 5B, in an upper case 300, a plurality of insertion grooves 310 into which a plurality of electronic components 240 are inserted are formed in a shape corresponding to the plurality of electronic components 240. Specifically, the insertion groove 310 may be formed in a shape corresponding to an upper surface of the electronic component 240 at a position where the electronic component 240 is mounted on the circuit board 200.

The above-described mounting groove 110 and insertion groove 310 may be formed by a wet etching technique, but are not limited thereto.

Figure 6A:
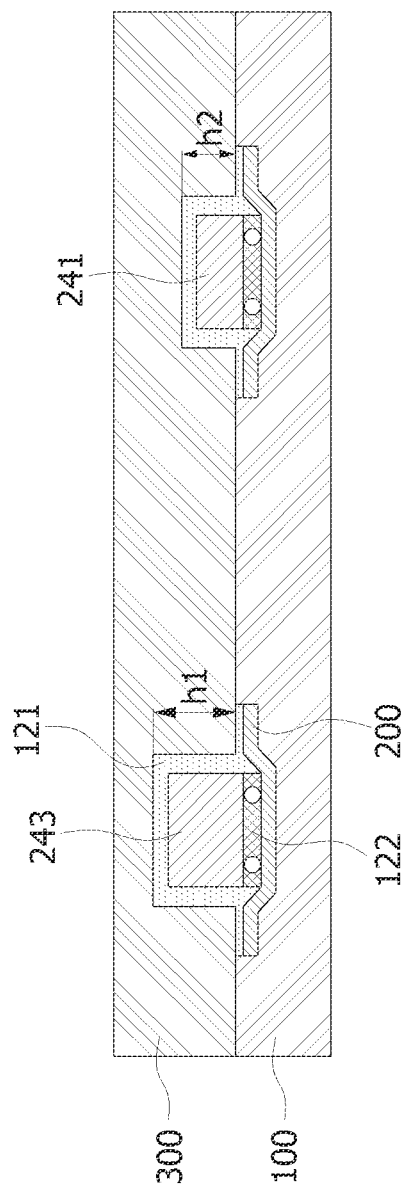
FIG. 6A is a cross-sectional view of a sensor mounted wafer according to an exemplary embodiment of the present invention, taken along VI-VI line of FIG. 5A.
Figure 6B:
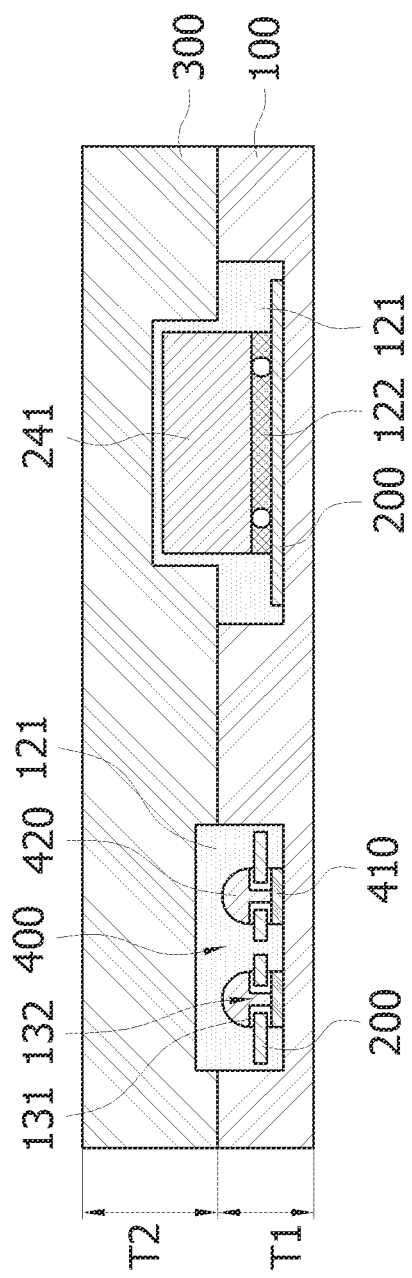
FIG. 6B is a cross-sectional view of a sensor mounted wafer according to an exemplary embodiment of the present invention, taken along VII-VII line of FIG. 5B.

FIG. 6A is a cross-sectional view of a sensor mounted wafer according to an exemplary embodiment of the present invention, taken along VI-VI line of FIG. 5A; and FIG. 6B is a cross-sectional view of a sensor mounted wafer according to an exemplary embodiment of the present invention, taken along VII-VII line of FIG. 5B.

Referring to FIGS. 6A and 6B, the sensor mounted wafer according to an embodiment of the present invention may include a lower case 100, a circuit board 200, an upper case 300, and a first adhesive layer 121.

The lower case 100 includes a mounting groove (110 in FIGS. 3A and 3B), and the circuit board 200 on which an electronic component 240 such as a sensor 241 and an IC chip 243 is mounted is placed in the mounting groove 110. Here, the electronic component 240 may be soldered to wiring of the circuit board 200, and the circuit board 200 may be attached to the mounting groove 110 of the lower case 100 by using an adhesive.

The upper case 300 includes a plurality of insertion grooves 310 having different depths, and is bonded together to the lower case 100 so that the electronic components 240 are inserted into the plurality of insertion grooves 310. And the first adhesive layer 121 is placed inside the mounting groove 110 and the plurality of insertion grooves 310. Here, the first adhesive layer 121 may be made of a Si-based material having a hardness of shore A40 or less and an elongation of 30% or more.

As shown in FIG. 6A, the plurality of insertion grooves 310 are formed to have different depths according to the heights of the plurality of electronic components 240. Accordingly, since the plurality of electronic components 240 may come into close contact with each of the insertion grooves 310, durability of the sensor mounted wafer may be improved, thereby preventing sensor mounted wafer warpage phenomenon when the temperature rises.

When the lower case 100 and the upper case 300 are bonded together, the first adhesive layer 121 is completely filled in the mounting groove 110 and the insertion groove 310 and is placed to surround the electronic component 240 so that pores are not included inside the mounting groove 110 and the insertion groove 310 with the lower case 100 and the upper case 300 bonded together.

As described above, the sensor mounted wafer according to an embodiment of the present invention may prevent the sensor mounted wafer warpage phenomenon caused by pore expansion due to temperature rise by placing the first adhesive layer 121 so that pores are not included inside the mounting groove 110 and the insertion groove 310.

In addition, the first adhesive layer 121 is characterized in that its thermal expansion coefficient is smaller than or the same as those of the lower case 100 and the upper case 300.

As described above, the sensor mounted wafer according to an embodiment of the present invention may prevent the sensor mounted wafer warpage phenomenon caused by expansion of the first adhesive layer 121 due to temperature rise by placing the first adhesive layer 121 having a relatively low thermal expansion coefficient between the mounting groove 110 and the insertion groove 310.

The sensor mounted wafer according to an embodiment of the present invention may further include a second adhesive layer 122 placed on a region where the electronic component 240 is mounted, that is, on a soldering region. Here, the soldering region includes an empty space between the circuit board 200 and the electronic component 240, and the second adhesive layer 122 formed by filling the empty space with an adhesive through an underfill process may prevent peeling of the electronic component 240 due to the sensor mounted wafer warpage phenomenon by performing a role of firmly fixing the electronic component 240 to the circuit board 200.

Here, the second adhesive layer 122 may be made of a contact epoxy material having a hardness of shore D50 or more and an elongation of 5% or less.

The sensor mounted wafer according to an embodiment of the present invention is characterized in that the thermal conductivity of the first adhesive layer 121 is higher than that of the second adhesive layer 122. For example, the thermal conductivity of the first adhesive layer 121 may be 0.8 W/m*K or more. To this end, the first adhesive layer 121 may include a separate thermally conductive material, and the thermally conductive material may be a non-conductive material to prevent a short of the electronic component 240.

As shown in FIG. 6A, the plurality of insertion grooves 310 may be formed to have depths corresponding to the heights of the plurality of electronic components 240. For example, a depth h1 of the insertion groove 310 into which the IC chip 243 is inserted may be formed relatively deeply corresponding to the height of the IC chip 243, and a depth h2 of the insertion groove 310 into which the sensor 241 is inserted may be formed to be relatively shallow corresponding to the height of the sensor 241.

The plurality of electronic components 240 may include a plurality of first electronic components having heights higher than a reference height and a plurality of second electronic components having heights lower than the reference height.

Here, the plurality of insertion grooves 310 may include a first insertion groove formed to have a depth corresponding to the height of the electronic component 240 having the highest height among the plurality of first electronic components and a second insertion groove formed to have a depth corresponding to the height of the electronic component 240 having the highest height among the plurality of second electronic components.

In this way, as the two insertion grooves 310 having different heights based on the reference height are formed, manufacturing costs may be reduced by reducing the manufacturing process compared to forming the insertion grooves 310 differently for each depth of the electronic components 240.

After the lower case 100 and the upper case 300 are bonded, the lower portion of the electronic component 240 may be located inside the mounting groove 110 of the lower case 100, and the upper portion of the electronic component 240 may be located inside the insertion groove 310 of the upper case 300.

In the mounting groove 110, portions in which the lower portions of the plurality of electronic components 240 are mounted may be formed to have a deeper depth than other portions. Here, if a height difference occurs due to the difference in the depth of the mounting groove 110, when the upper case 300 and the lower case 100 are bonded together, the circuit board 200 corresponding to the lower edge of the plurality of electronic components 240 also shows the height difference (sharp bending), resulting in a problem of increasing resistance.

In order to solve this problem, as shown in FIG. 6A, it is preferable that the mounting groove 110 has an inclined plane formed corresponding to the lower edges of the plurality of electronic components 240.

Accordingly, the circuit board 200 corresponding to the lower edges of the plurality of electronic components 240 is also gently bent along the inclined plane formed in the mounting groove 110 to reduce resistance.

The sensor mounted wafer has a structure that the upper case 300 and the lower case 100 are combined, and when the upper case 300 and the lower case 100 are formed to have the same thickness of 750 μm, the thickness of the sensor mounted wafer is a total of 1500 μm. However, if the thickness of the wafer is 1200 μm or more, there is a problem that the number of wafers is recognized as two.

In order to solve such a problem, reducing the thickness of the upper case 300 and the lower case 100 simultaneously complicates the process and increases the manufacturing cost. In addition, reducing the thickness of the upper case 300 among the upper case 300 and the lower case 100 may result in support issues for components such as electronic components 243 inserted in the upper case 300.

Accordingly, as shown in FIG. 6B, the sensor mounted wafer according to an embodiment of the present invention may solve such a problem by forming the thickness T1 of the lower case 100 to be thinner than the thickness T2 of the upper case 300 to make the total thickness of the plasma sensor mounted wafer as 1200 μm or less.

Referring to FIG. 6B, the sensor 241 may be a plasma sensor 241, and a sensing probe 400 includes a pair of probe pads 410 placed in the mounting groove 110 and is connected to the plasma sensor 241 through wiring formed on the circuit board 200. Here, the pair of probe pads 410 may be made of a conductive material and may be deposited in the mounting groove 110 to have a predetermined thickness.

The plasma sensor 241 senses the density and uniformity of plasma based on the capacitance between the pair of probe pads 410.

The sensing probe 400 may include a contact hole 132 formed in the wiring end 131, and a conductive pattern 420 passing through the contact hole 132 to connect the pair of probe pads 410 and the wiring end 131.

Here, the contact holes 132 are respectively formed at positions corresponding to the pair of probe pads 410. In addition, the conductive pattern 420 may be made of silver (Ag) dots formed through silver (Ag) paste, but is not limited thereto and may be made of various conductive materials formed by various forming methods.

In the conventional sensor mounted wafer, the sensing probe is directly exposed to the outside to sense the density of plasma. However, such conventional plasma sensor mounted wafer has a problem of contaminating the interior of the chamber due to the exposed sensing probe.

In order to solve such a problem, the sensor mounted wafer according to an embodiment of the present invention, unlike the conventional ones, makes the sensing probe 400, without exposing it to the outside, to sense the density and uniformity of the plasma based on the capacitance between the pair of probe pads 410 that is changed according to the external plasma density.

FIGS. 7A to 7E are sequence diagrams of a method of manufacturing a sensor mounted wafer according to an exemplary embodiment of the present invention based on FIG. 6A.

Figure 7A:
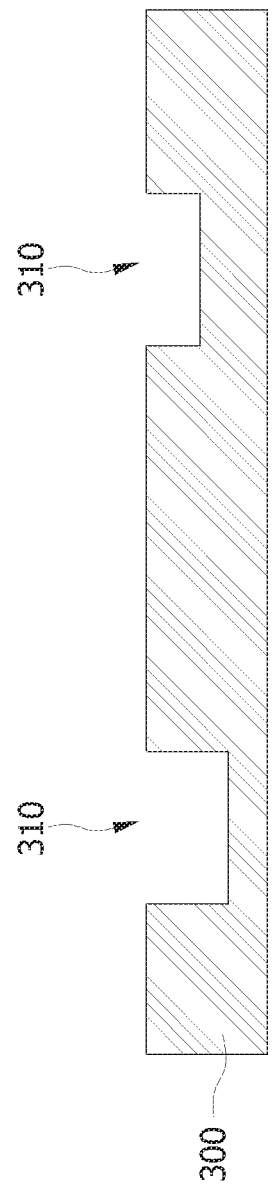

First, as shown in FIG. 7A, a plurality of insertion grooves 310 having different depths are formed in a shape corresponding to a plurality of electronic components 240 on an upper case 300. In this case, the insertion groove 310 may be formed by a wet etching technique.

Here, the plurality of insertion grooves 310 are formed to have different depths according to the heights of the plurality of electronic components 240. Accordingly, since the plurality of electronic components 240 may come into close contact with each of the insertion grooves 310, durability of the sensor mounted wafer may be improved, thereby preventing sensor mounted wafer warpage phenomenon when the temperature rises.

In addition, the plurality of insertion grooves 310 may be formed to have depths corresponding to the heights of the plurality of electronic components 240.

In addition, the plurality of electronic components 240 may include a plurality of first electronic components having heights higher than a reference height and a plurality of second electronic components having heights lower than the reference height.

Here, the plurality of insertion grooves 310 may include a first insertion groove formed to have a depth corresponding to the height of the electronic component 240 having the highest height among the plurality of first electronic components and a second insertion groove formed to have a depth corresponding to the height of the electronic component 240 having the highest height among the plurality of second electronic components.

In this way, as the two insertion grooves 310 having different heights based on the reference height are formed, manufacturing costs may be reduced by reducing the manufacturing process compared to forming the insertion grooves 310 differently for each depth of the electronic components 240.

Next, as shown in FIG. 7B, a first adhesive 121a is applied to the plurality of insertion grooves 310 formed in the upper case 300, the plurality of electronic components 240 are inserted into the plurality of insertion grooves 310, and the first adhesive 121a is cured.

Figure 7C:
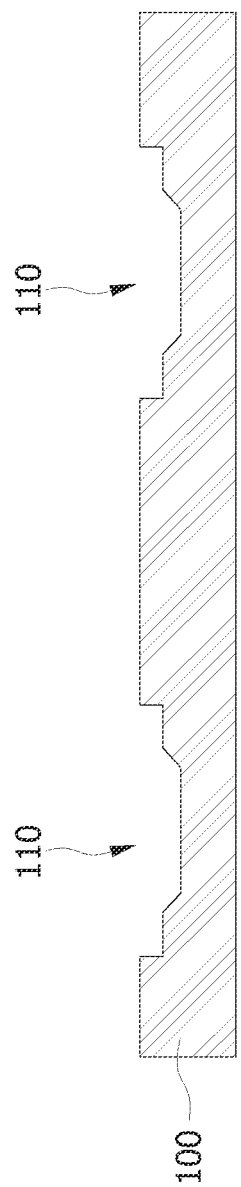

Next, as shown in FIG. 7C, a mounting groove 110 is formed in a shape corresponding to a circuit board 200 in a lower case 100. In this case, the mounting groove 110 may be formed by a wet etching technique.

Here, in the mounting groove 110, portions in which the lower portions of the plurality of electronic components 240 are mounted may be formed to have a deeper depth than other portions.

Figure 7D:
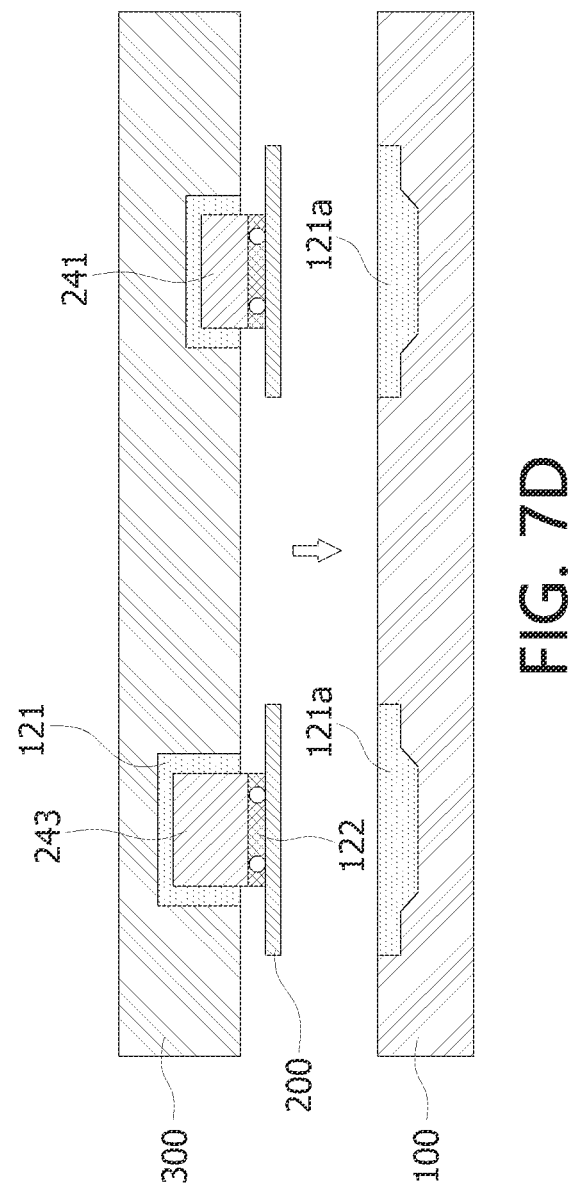

Next, as shown in FIG. 7D, the first adhesive 121a is applied to the mounting groove 110, and the lower case 100 and the upper case 300 are bonded together so that the circuit board 200 is mounted in the mounting groove 110.

Here, the lower case 100 and the upper case 300 are bonded together so that the mounting groove 110 of the lower case 100 faces upward and the insertion groove 310 of the upper case 300 faces downward. This is to prevent that if bonding is performed with the mounting groove 110 of the lower case 100 facing downward, the first adhesive 121a that has not yet been cured flows down by gravity in the bonding process.

As described above, if the height difference occurs due to the difference in the depth of the mounting groove 110, when the upper case 300 and the lower case 100 are bonded together, the circuit board 200 corresponding to the lower edge of the plurality of electronic components 240 also shows the height difference (sharp bending), resulting in a problem of increasing resistance.

In order to solve this problem, it is preferable that the mounting groove 110 has an inclined plane formed corresponding to the lower edges of the plurality of electronic components 240.

Accordingly, the circuit board 200 corresponding to the lower edges of the plurality of electronic components 240 is also gently bent along the inclined plane formed in the mounting groove 110 to reduce resistance.

Figure 7E:
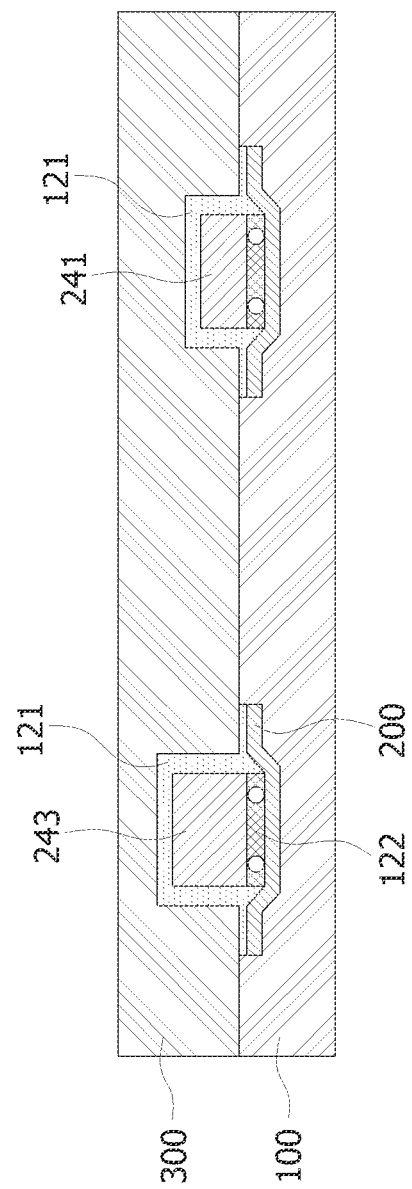

Next, as shown in FIG. 7E, in the above-described bonding process, the first adhesive 121a applied to the mounting groove 110 spreads to the bonding surface of the lower case 100 and the upper case 300 due to the circuit board 200, and when the first adhesive 121a spread on the bonding surface is cured, the lower case 100 and the upper case 300 are bonded together and a first adhesive layer 121 is formed to surround the electronic component 240.

FIGS. 8A to 8I are sequence diagrams of a method of manufacturing a sensor mounted wafer according to an exemplary embodiment of the present invention based on FIG. 6B.

Hereinafter, the same contents as those described in FIGS. 7A to 7I will be omitted.

First, as shown in FIG. 8A, a mounting groove 110 is formed in a lower case 100. In this case, the thickness of the lower case 100 is formed to be thinner than the thickness of an upper case 300.

Figure 8B:
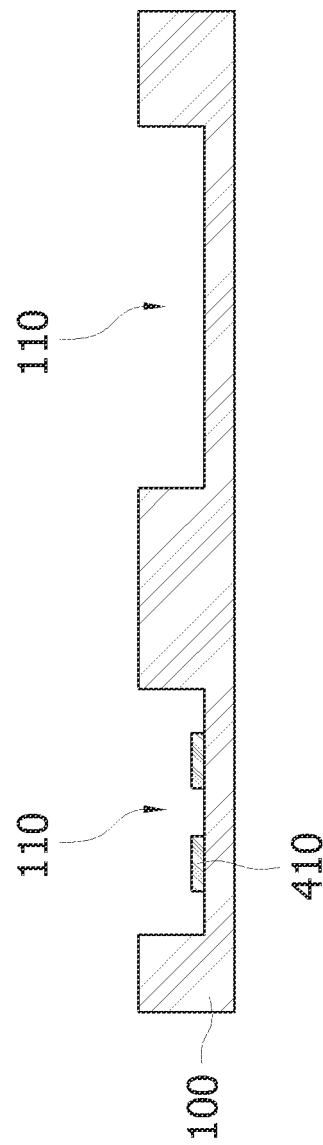

Next, as shown in FIG. 8B, a pair of probe pads 410 are formed in the mounting groove 110. In this case, the pair of probe pads 410 may be formed by depositing a conductive material in the mounting groove 110.

Next, as shown in FIG. 8C, the circuit board 200 is mounted in the mounting groove 110 of the lower case 100. In this case, a contact hole 132 is formed in a wiring end 131 printed on the circuit board 200, and the contact hole 132 is placed to correspond to a pair of conductive pads 410.

Figure 8D:
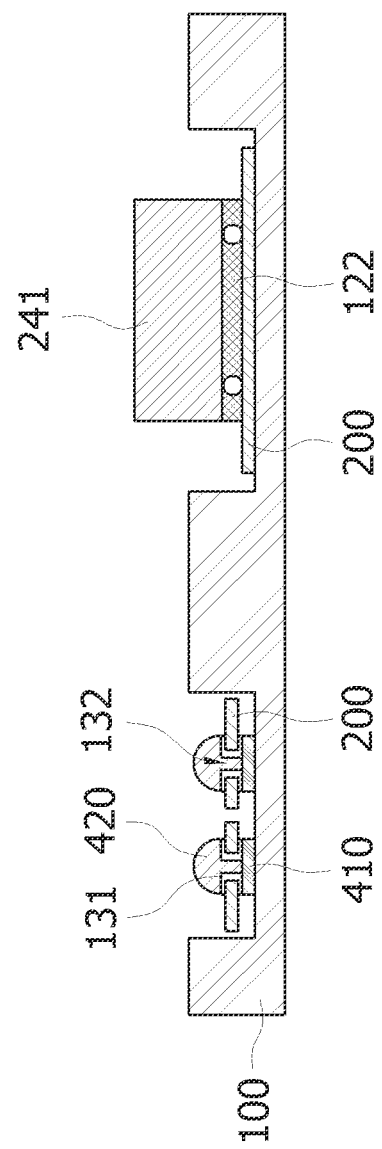

Next, as shown in FIG. 8D, a conductive pattern 420 is passed through the contact hole 132 to connect the pair of probe pads 410 and the wiring end 131. In this case, the conductive pattern 420 may be made of silver (Ag) dots formed through silver (Ag) paste, but is not limited thereto and may be made of various conductive materials formed by various forming methods. The pair of probe pads 410 and the conductive pattern 420 formed as described above constitute a sensing probe 400.

Figure 8E:
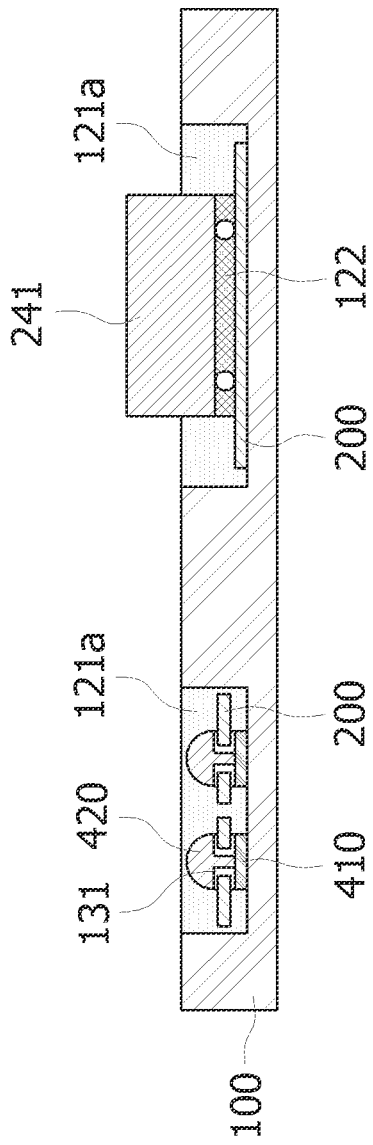

Next, as shown in FIG. 8E, the first adhesive 121a is applied to the mounting groove 110 in which the circuit board 200 is mounted, and then cured. Accordingly, a first adhesive layer 121 is formed inside the mounting groove 110 in which the sensing probe 400, a plasma sensor 241, and a IC chip 243 are mounted.

Next, as shown in FIG. 8F, an insertion groove 310 is formed in a shape corresponding to the plasma sensor 241 and the IC chip 243 on one surface of the upper case 300.

Figure 8G:
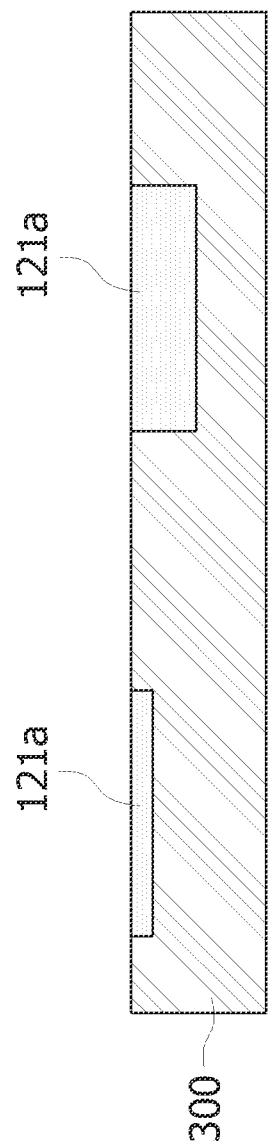
Figure 8H:
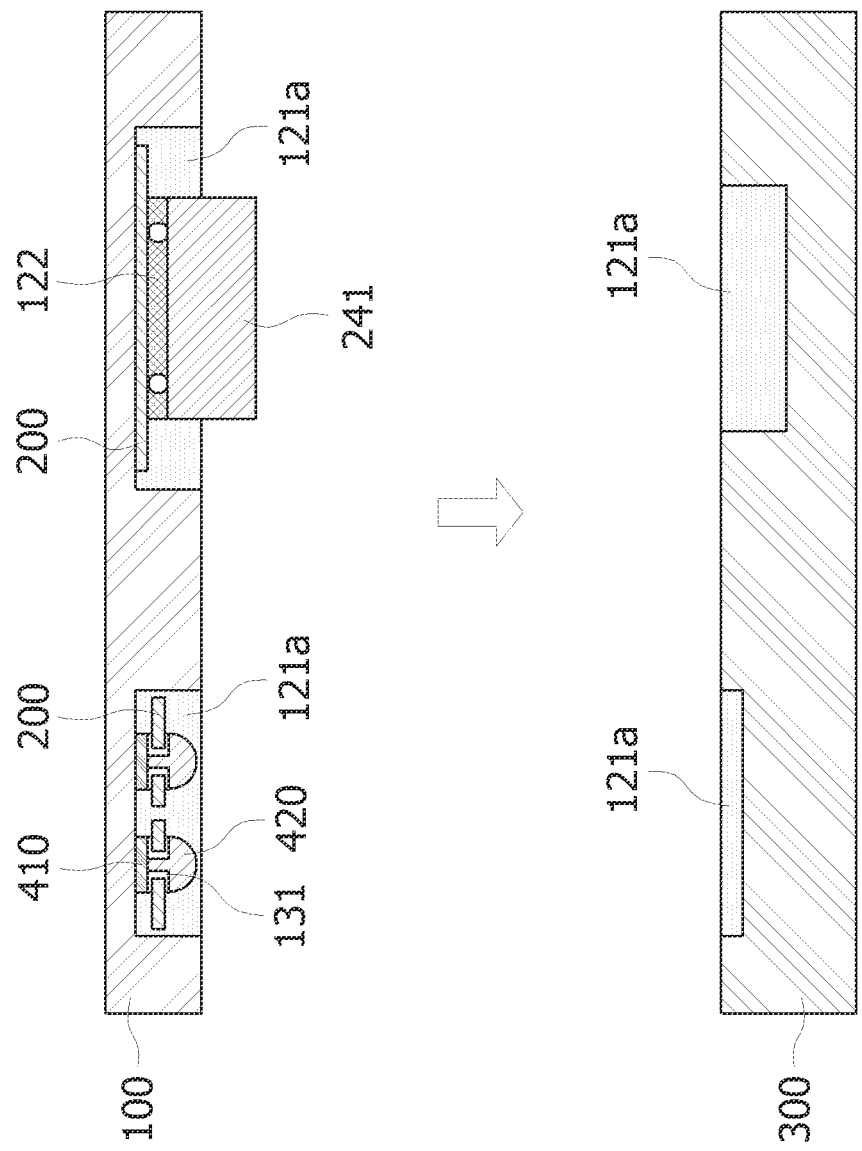
Figure 8I:
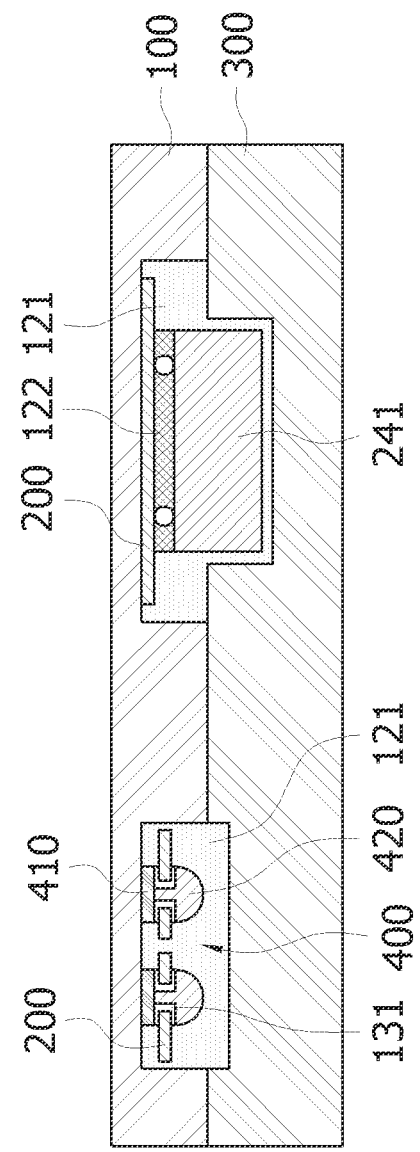

Next, as shown in FIGS. 8G to 8I, the first adhesive 121a is applied to the insertion groove 310 formed in the upper case 300; and the lower case 100 and the upper case 300 are bonded together so that the plasma sensor 241 and the IC chip 243 are inserted into the insertion groove 310 before the first adhesive 121a is cured.

Here, as shown in FIG. 8H, the lower case 100 and the upper case 300 are bonded together so that the insertion groove 310 of the upper case 300 faces upward and the mounting groove 110 of the lower case 100 faces downward.

As described above, the method of manufacturing the sensor mounted wafer according to an embodiment of the present invention may solve the problem that the plasma sensor mounted wafer is recognized as two wafers by forming the thickness of the lower case 100 to be thinner than the thickness of the upper case 300.

In addition, the method of manufacturing the sensor mounted wafer according to an embodiment of the present invention may, unlike the conventional ones, solve the problem of contamination inside the chamber by making the sensing probe 400, without exposing it to the outside, to sense the density and uniformity of the plasma based on the capacitance between the pair of probe pads 410 that is changed according to the external plasma density.

While this invention has been described in connection with what is presently considered to be practical exemplary embodiments, it will be apparent to those of ordinary skill in the art that the described embodiments may be embodied in various modified forms within the scope which does not depart from the essential characteristics of the present invention.

The embodiments of the present invention disclosed in the present specification and drawings are only provided for specific examples to easily describe the technical content of the present invention and to aid understanding of the present invention, and are not intended to limit the scope of the present invention. Therefore, the scope of the present invention should be construed that all changes or modifications derived based on the technical idea of the present invention in addition to the embodiments disclosed herein are included in the scope of the present invention.

This work was supported by Korea Evaluation Institute of Industrial Technology grant funded by the Ministry of Trade, Industry and Energy (MOTIE, Republic of Korea)(No. 10077629)

What is claimed is:

1. A sensor mounted wafer, comprising:
a lower case, wherein a mounting groove is formed in the lower case;
a circuit board, wherein a plurality of electronic components having different heights are mounted on the circuit board, and the circuit board is placed in the mounting groove;
an upper case, wherein a plurality of insertion grooves having different depths are formed in the upper case, and the upper case is bonded together to the lower case, wherein the plurality of electronic components are inserted into the plurality of insertion grooves; and
a first adhesive layer placed between the mounting groove and the plurality of insertion grooves,
wherein the plurality of electronic components comprise a plurality of first electronic components having heights higher than a reference height and a plurality of second electronic components having heights lower than the reference height,
wherein the plurality of insertion grooves comprise:
a first insertion groove including the plurality of first electronic components, wherein the first insertion groove is formed to have a single depth corresponding to a height of an electronic component having a first highest height among the plurality of first electronic components, the plurality of first electronic components having different heights from each other, the different heights of the plurality of first electronic components less than or equal to the height of the electronic component having the first highest height, and
a second insertion groove including the plurality of second electronic components, wherein the second insertion groove is formed to have a single depth corresponding to a height of an electronic component having a second highest height among the plurality of second electronic components, the plurality of second electronic components having different heights from each other, the different heights of the plurality of second electronic components less than or equal to the height of the electronic component having the second highest height wherein the mounting groove has a deeper depth at portions where the plurality of electronic components are mounted than at other portions,
wherein the mounting groove includes at least one inclined plane formed adjacent to at least one lower edge of at least one electronic component of the plurality of electronic components, wherein the at least one inclined plane is inclined with respect to the at least one lower edge, and
wherein the circuit board is located on the at least one inclined plane and is bent along the at least one inclined plane.

2. The sensor mounted wafer of claim 1, wherein the plurality of insertion grooves are formed to have the different depths corresponding to the different heights of the plurality of the electronic components.

3. The sensor mounted wafer of claim 1, wherein lower portions of the plurality of electronic components are located inside the mounting groove and upper portions of the plurality of electronic components are located inside the plurality of insertion grooves.

4. The sensor mounted wafer of claim 1, wherein the plurality of electronic components comprise a plasma sensor.

5. The sensor mounted wafer of claim 4, further comprising:
a sensing probe comprising a pair of probe pads placed in the mounting groove, wherein the sensing probe is connected to the plasma sensor through a wiring formed on the circuit board, wherein the plasma sensor senses a plasma based on a capacitance between the pair of probe pads.

6. The sensor mounted wafer of claim 5, wherein a thickness of the lower case is thinner than a thickness of the upper case.

7. The sensor mounted wafer of claim 5, wherein the sensing probe further comprises a contact hole of contact holes formed in a wiring end, and a conductive pattern passing through the contact hole to connect the pair of probe pads and the wiring end.

8. The sensor mounted wafer of claim 7, wherein the contact holes are respectively formed at positions corresponding to the pair of probe pads.

9. The sensor mounted wafer of claim 1, further comprising a second adhesive layer, wherein the second adhesive layer is formed between at least one of the plurality of electronic components and the circuit board.

10. The sensor mounted wafer of claim 9, wherein the second adhesive layer comprises a contact epoxy a hardness of shore D50 or more and an elongation of 5% or less.

11. The sensor mounted wafer of claim 9, wherein a thermal conductivity of the first adhesive layer is higher than a thermal conductivity of the second adhesive layer.

12. The sensor mounted wafer of claim 11, where the thermal conductivity of the first adhesive layer is 0.8 W/m*K.

13. The sensor mounted wafer of claim 1, wherein at least one of the plurality of first electronic components comprises a communication IC chip configured to wirelessly transmit sensing information and wirelessly receive control information.

* * * * *